United States Patent
Zhang et al.

(10) Patent No.: US 8,360,138 B2
(45) Date of Patent: Jan. 29, 2013

(54) SYSTEM AND METHOD THAT DISSIPATE HEAT FROM AN ELECTRONIC DEVICE

(75) Inventors: Chunbo Zhang, Manhattan Beach, CA (US); Yuandong Gu, Plymouth, MN (US); Martin Kristoffersen, Maplewood, MN (US); Francis A. Kulacki, Edina, MN (US); Brian C. Krafthefer, Stillwater, MN (US)

(73) Assignees: Honeywell International Inc., Morristown, NJ (US); Regents of the University of Minnesota, St. Paul, MN (US)

( * ) Notice: Subject to any disclaimer, the term of this patent is extended or adjusted under 35 U.S.C. 154(b) by 0 days.

(21) Appl. No.: 13/212,738

(22) Filed: Aug. 18, 2011

(65) Prior Publication Data

US 2011/0297354 A1 Dec. 8, 2011

Related U.S. Application Data

(62) Division of application No. 11/637,642, filed on Dec. 12, 2006, now Pat. No. 8,011,421.

(51) Int. Cl.
*F28B 1/00* (2006.01)
*H05K 7/20* (2006.01)

(52) U.S. Cl. .................... 165/110; 165/104.21

(58) Field of Classification Search ............. 165/80.4, 165/104.21, 110, 111; 361/699, 700; 257/714, 257/715
See application file for complete search history.

(56) References Cited

U.S. PATENT DOCUMENTS

| 3,258,933 A | | 7/1966 | Osborne et al. |
| 3,406,244 A | * | 10/1968 | Oktay .......................... 174/15.1 |
| 3,417,814 A | * | 12/1968 | Oktay ...................... 165/104.13 |
| 4,653,579 A | * | 3/1987 | Fujii et al. ................ 165/104.29 |
| 5,427,174 A | * | 6/1995 | Lomolino et al. ........ 165/104.13 |
| 5,761,037 A | | 6/1998 | Anderson et al. |
| 5,796,798 A | * | 8/1998 | Aujollet et al. ............... 376/283 |
| 6,005,772 A | | 12/1999 | Terao et al. |
| 6,397,936 B1 | | 6/2002 | Crowley et al. |
| 6,962,831 B2 | | 11/2005 | Najafi et al. |
| 7,013,956 B2 | * | 3/2006 | Thayer et al. ............ 165/104.25 |
| 7,665,325 B2 | | 2/2010 | Campbell et al. |
| 2003/0062149 A1 | | 4/2003 | Goodson et al. |

(Continued)

FOREIGN PATENT DOCUMENTS

DE 19852125 4/2000

OTHER PUBLICATIONS

"U.S. Appl. No. 11/637,642, Final Office Action mailed Mar. 18, 2011", 9 pgs.

(Continued)

*Primary Examiner* — Tho V Duong
(74) *Attorney, Agent, or Firm* — Schwegman, Lundberg & Woessner, P.A.

(57) ABSTRACT

The electronic system includes an electronic device and a liquid holding section that is thermally coupled to the electronic device. The electronic system further includes an impermeable section that engages the liquid holding section. The impermeable section includes a channel and a plurality of passages that provide fluid communication between the liquid holding section and the channel. The electronic system further includes (i) a first fluid that flows through the channel in the impermeable section to facilitate heat transfer from the electronic device to the first fluid; and (ii) a second fluid that flows from the liquid holding section through the plurality of passages into the channel when the second fluid boils within the liquid holding section due to heat transfer from the electronic device to the second fluid. In some embodiments, the first and second fluids are different types of substances.

5 Claims, 3 Drawing Sheets

U.S. PATENT DOCUMENTS

| | | | |
|---|---|---|---|
| 2003/0205363 A1* | 11/2003 | Chu et al. | 165/80.3 |
| 2004/0040328 A1* | 3/2004 | Patel et al. | 62/259.2 |
| 2005/0286227 A1 | 12/2005 | Erturk et al. | |
| 2006/0162363 A1 | 7/2006 | Sharma et al. | |
| 2007/0273024 A1* | 11/2007 | Madsen et al. | 257/715 |
| 2007/0295480 A1 | 12/2007 | Campbell et al. | |
| 2007/0295481 A1 | 12/2007 | Campbell et al. | |

OTHER PUBLICATIONS

"U.S. Appl. No. 11/637,642, Non Final Office Action mailed Nov. 15, 2010", 8 pgs.

"U.S. Appl. No. 11/637,642, Notice of Allowance mailed Apr. 29, 2011", 8 pgs.

"U.S. Appl. No. 11/637,642, Response filed Apr. 30, 2010 to Restriction Requirement mailed Apr. 21, 2010", 5 pgs.

"U.S. Appl. No. 11/637,642, Response filed Dec. 15, 2010 to Non Final Office Action mailed Nov. 15, 2010", 8 pgs.

"U.S. Appl. No. 11/637,642, Response filed Apr. 12, 2011 to Final Office Action mailed Mar. 18, 2011", 7 pgs.

"U.S. Appl. No. 11/637,642, Restriction Requirement mailed Apr. 21, 2010", 8 pgs.

"International Application Serial No. PCT/US2007/086483, Search Report and written opinion mailed on Sep. 5, 2008.", P220.

\* cited by examiner

SYSTEM AND METHOD THAT DISSIPATE HEAT FROM AN ELECTRONIC DEVICE

RELATED APPLICATIONS

This application is a divisional of U.S. patent application Ser. No. 11/637,642, filed Dec. 12, 2006, which application is incorporated herein by reference in its entirety.

BACKGROUND

The present invention relates generally to the field of electronic devices, and in particular to the thermal management of high-powered electronic devices.

Electronic devices generate heat during operation. Thermal management refers to the ability to keep temperature-sensitive elements in an electronic device within a prescribed operating temperature. Thermal management has continually evolved to address the increased heat generation created within such electronic devices as a result of the increased processing speed/power that is usually associated with each new generation of electronic devices.

Historically, electronic devices were cooled by a natural convection thermal management technique. The cases or packaging of these prior art electronic devices were designed with openings (e.g., slots) strategically located to allow warm air to escape and cooler air to be drawn in.

The advent of high performance electronic devices now requires more innovative thermal management. Each increase in processing speed and power generally carries a "cost" of increased heat generation such that natural convection is no longer sufficient to provide proper thermal management.

Several methods have been employed for cooling high performance electronic devices. One common method of cooling an electronic device includes attaching one or more heat sinks to the electronic device. A heat sink is typically used in combination with a fan that forces air to pass by the heat sink and/or the electronic device.

There are several problems with cooling systems that utilize some form of a heat sink and fan combination. One problem is that more air flow is generally needed in order adequately dissipate heat from the electronic device. This increase in air flow is typically generated by a larger fan and/or increased fan speed which can result in unwanted acoustic noise. Another problem is that the fan must typically be located too closely to the fins of the heat sink to generate fully developed air flow. In addition, when a large fan is used in conjunction with a heat sink to cool an electronic component, a large percentage of the air moved by the system fan does not go through the heat sink. As a result, even large fans are not a sufficient thermal solution for cooling some electronic devices.

An alternative and more costly system to manage the thermal energy output of high-powered electronic devices is a liquid cooling system. Most liquid cooling systems include a heat exchanger that is thermally connected to the electronic device.

A relatively recent trend has seen the use of "two-phase" cooling systems to cool high-powered electronic devices. These two phase cooling systems include an evaporator or flow channels that remove thermal energy from the electronic device. The thermal energy causes a coolant within the evaporator or flow channels to turn from a liquid into a vapor (i.e., to evaporate) or vapor-liquid mixture.

These "two-phase" cooling systems suffer from several drawbacks. One drawback is that the systems require the use of a pump. These pumps require maintenance and commonly break down or leak onto one or more of the electrical components. Another drawback is that many electronic devices are now putting out so much thermal energy that existing two-phase cooling systems often have trouble thermally managing electronic devices under more extreme operating conditions.

Since many electronic systems are not able to effectively cool the high performance electronic devices that are within such systems under certain operating conditions, an electronic system is needed that provides superior cooling to high-powered electronic devices under a variety of operating conditions.

SUMMARY

Some example embodiments of the present invention relate to an electronic system that includes an electronic device and a liquid holding section that is thermally coupled to the electronic device. The electronic system further includes an impermeable section that engages the liquid holding section. The impermeable section includes a channel and a plurality of passages that provide fluid communication between the liquid holding section and the channel.

The electronic system further includes (i) a first fluid that flows through the channel in the impermeable section to facilitate heat transfer from the electronic device to the first fluid; and (ii) a second fluid that flows from the liquid holding section through the plurality of passages into the channel when the second fluid boils within the liquid holding section due to heat transfer from the electronic device to the second fluid. In some embodiments, the first fluid is one type of substance (e.g., water) and the second fluid is a different type of substance (e.g., FC-72).

As the second fluid emerges from each of the passages, the second fluid mixes with the first fluid such that the flow within the channel becomes more turbulent. This more turbulent flow within the channel increases the capacity of the first and second fluids to transfer heat from the electronic device.

In some embodiments, the method may further include opening one or more valves that prevent the flow of the second fluid from the passages into the channel. It should be noted that opening one or more the valves may include (i) raising the temperature of the valves to a certain level; and/or (ii) exposing the valves to a pressure within the passages that is sufficient to open the valves.

Other example embodiments of the present invention relate to a method of cooling an electronic device. The method includes transferring heat from the electronic device to a first fluid that flows through a channel in an impermeable section. The method further includes transferring heat from the electronic device to a liquid holding section that includes a second fluid. The heat is transferred to the second fluid until the second fluid boils and passes through a plurality of passages in the impermeable section into the channel in the impermeable section. In some embodiments, the first and second fluids are different substances such that the method further includes separating the first fluid from the second fluid once the first and second fluids exit the channel in the impermeable section.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
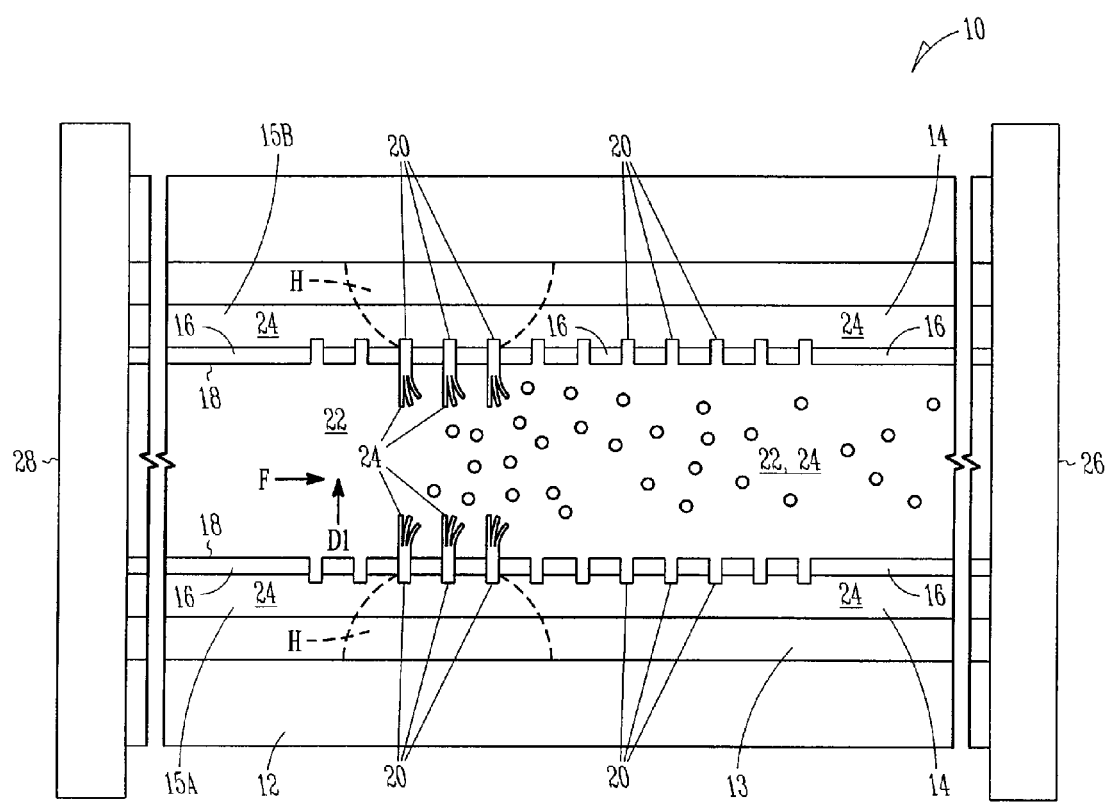
FIG. 1 is a schematic side view of an example electronic system.

FIG. 1 illustrates an example electronic system 10. The electronic system 10 includes an electronic device 12 and a liquid holding section 14 that is thermally coupled to the electronic device 12.

The electronic system 10 further includes an impermeable section 16 that engages the liquid holding section 14. The impermeable section 16 includes a channel 18 and a plurality of passages 20 that provide fluid communication between the liquid holding section 14 and the channel 18. In some embodiments, the electronic system 10 may further include an interface 13 that facilitates transferring heat (identified as H in the figures) from the electronic device 12 to the liquid holding section 14.

During operation of the electronic system 10 a first fluid 22 flows through the channel 18 in the impermeable section 16 to facilitate heat transfer from the electronic device 12 to the first fluid 22. In addition, a second fluid 24 flows from the liquid holding section 14 through the plurality of passages 20 into the channel 18 when the second fluid 24 boils within the liquid holding section 14 due to heat transfer from the electronic device 12 to the second fluid 24. As shown in the figures, the electronic device 12 may generate localized "hot spots" during operation so that differing amounts of heat may be transferred to the liquid holding section 14 from the electronic device 12 depending on the design of the electronic device 12.

In some embodiments, the first fluid 22 and the second fluid 24 are the same substance while in other embodiments the first fluid 22 and the second fluid 24 are different substances. As an example, the first fluid 22 may be water and the second fluid 24 may be FC-72.

It should be noted that in those embodiments where the first and second fluids 22, 24 are different substances, the electronic system 10 may further include a separator 26 that separates the first fluid 22 from the second fluid 24 after the first and second fluids 22, 24 exit the channel 18. In addition, the electronic system 10 may further include a pump 28 that forces the first fluid 22 to flow through the channel 18 in the impermeable section 16.

In some embodiments, the liquid holding section 14 spreads the second fluid 24 throughout the liquid holding section 14 via capillary action that takes place within the liquid holding section 14. The manner in which the second fluid 24 is brought into contact with the liquid holding section 16 will depend in part on the overall configuration of the electronic system 10.

One example material for the liquid holding section 14 is porous silicon while an example material for the impermeable section 16 is silicon. In addition, the passages 20 in the impermeable section 16 may range from about 1 to 300 square μm in cross-section size while the channel 18 in the impermeable section 16 may range from about 20 to 1000 square μm in cross-section size (although other cross-section sizes are possible).

Figure 2:
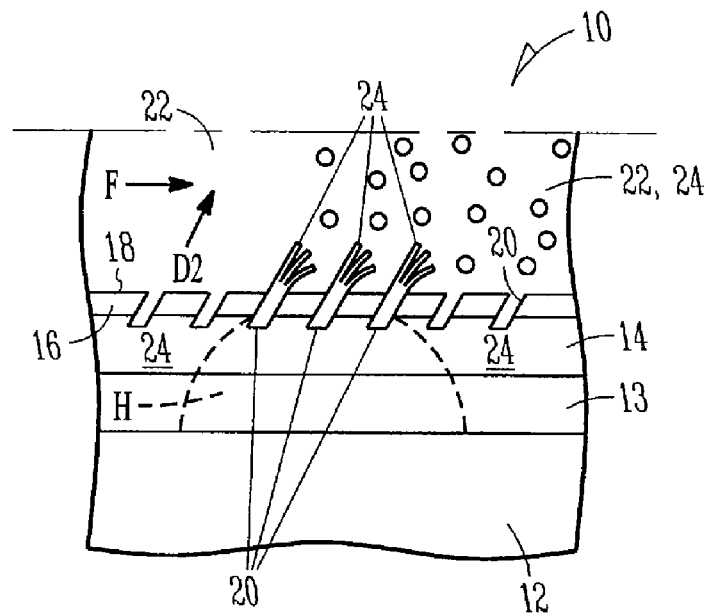
FIG. 2 is an enlarged schematic side view illustrating a portion of another example embodiment of the electronic system shown in FIG. 1.
Figure 3:
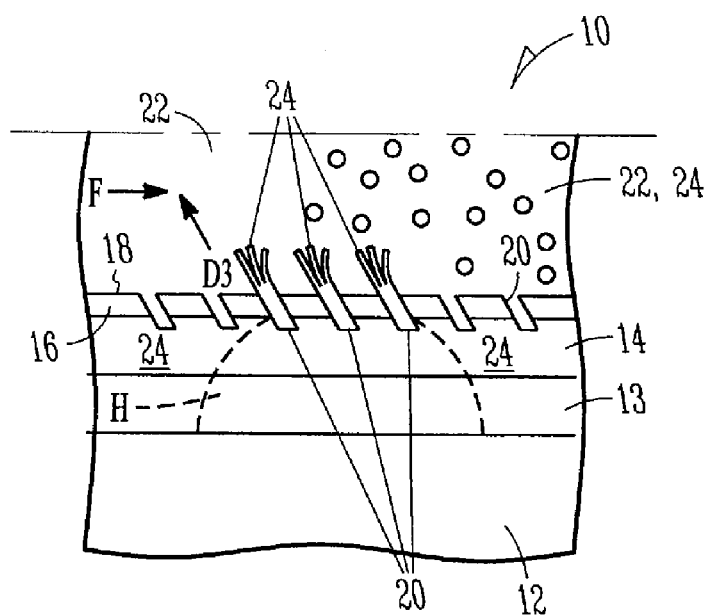
FIG. 3 is an enlarged schematic side view similar to FIG. 2 illustrating a portion of another example embodiment of the electronic system shown in FIG. 1.

In the example embodiment that is illustrated in FIG. 1, the first fluid 22 flows through the channel 18 in a first direction F and the second fluid 24 initially flows from the plurality of passages 20 into the channel 18 in a second direction D1 which is orthogonal to the first direction F. FIG. 2 illustrates an example embodiment where the second fluid 24 initially flows from the plurality of passages 20 into the channel 18 in a second direction D2 that is at least partially the same as the first direction F. FIG. 3 illustrates an example embodiment where the second fluid 24 initially flows from the plurality of passages 20 into the channel 18 in a second direction D3 that is at least partially opposite to the first direction F.

As the second fluid 24 emerges from each of the passages 20, the second fluid 24 mixes with the first fluid 22 such that the flow of fluid within the channel 18 becomes more turbulent. This more turbulent flow increases the capacity of the first and second fluids 22, 24 to transfer heat from the electronic device 12.

In the example embodiment that is illustrated in FIG. 2, the second fluid 24 may provide a sufficient force to move the first and second fluids 22, 24 through the channel 18 in direction F without the use of a pump. Eliminating or reducing the need to use of a pump to drive the first and/or second fluids 22, 24 through the channel 18 would remove or minimize many of the drawbacks that are associated with using a pump as part of an electronic system 10.

Although the second fluid 24 is shown in each of the FIGS. 1-3 as exiting from each of the passages 20 in the same direction, some of the passages 20 may direct the second fluid 24 into the channel 18 in different directions. In addition, it should be noted that while FIG. 1 appears to show that the second fluid 24 enters the channel 18 from only above and below the channel 18, the second fluid 24 may enter the channel 18 from any orientation (i.e., above, below and/or sides), or any combination of orientations. The orientation (or orientations) from which the second fluid 24 enters the channel 18 will depend in part on the overall design of the electronic system 10.

In the example embodiment that is illustrated in FIG. 1, the liquid holding section 14 is formed of two layers 15A, 15B. It should be noted that the number and arrangement of the layers that form the liquid holding section 14 and the impermeable section 16 will depend in part on the overall configuration of the electronic system 10 as well as manufacturing considerations related to fabricating the electronic system 10.

In addition, the impermeable section 16 may include multiple channels 18. The number of layers and/or channels 18 will depend in part on the size of the electronic device 12 and the cooling requirements of the electronic device 12.

Figure 4:
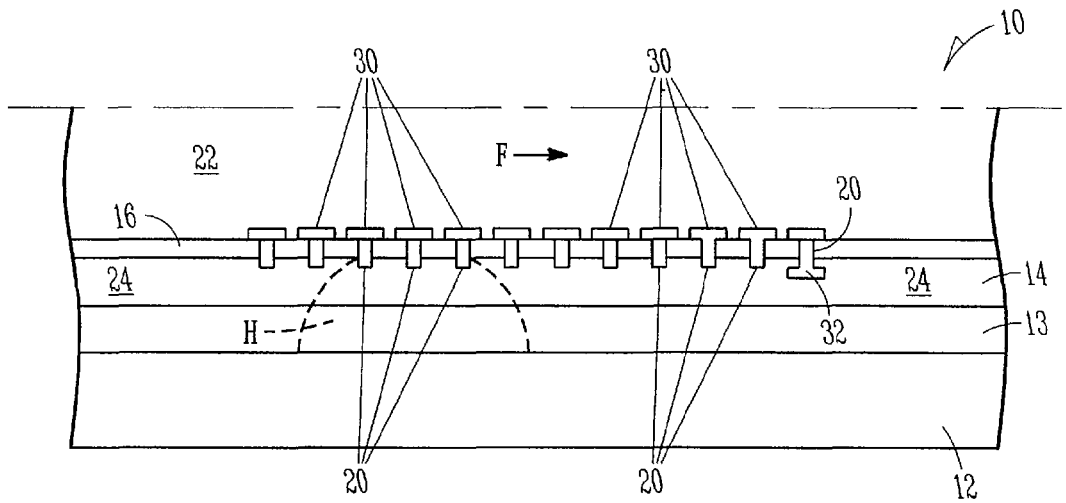
FIG. 4 is a schematic side view of an example electronic system that includes a plurality of closed valves.
Figure 5:
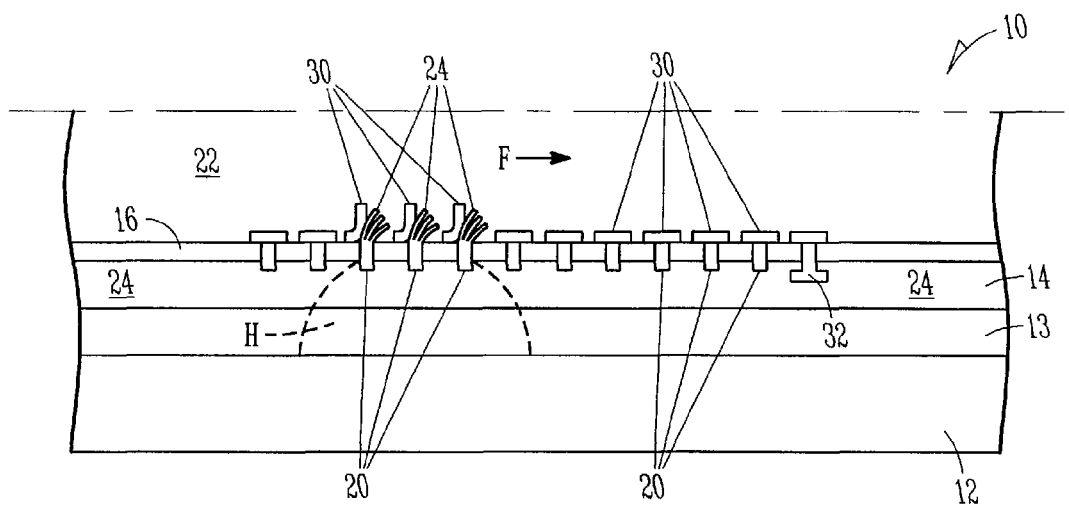
FIG. 5 is a schematic side view of the example electronic system shown in FIG. 4 with some of the valves open.

FIGS. 4-5 illustrate an example embodiment of the electronic system 10 where the electronic system 10 includes a plurality of valves 30. As shown in FIG. 4, each of the plurality of valves 30 prevents the second fluid 24 from leaving a passage 20. In some embodiments, the valves 30 prevent the second fluid 24 from leaving a respective passage 20 until (i) each respective valve 30 reaches a desired temperature; and/or (ii) the pressure within each respective passage 20 reaches a desired level. The temperature and/or pressure levels that would be required to open each valve 30 may be determined in part by the material that is selected for each valve 30 and the size of each valve 30.

Some example materials for the valves 30 include a shape memory alloy (SMA). Some SMA's are a metal that "remembers" its geometry. Some example types of SMAs include copper-zinc-aluminium, copper-aluminium-nickel, and nickel-titanium (NiTi) alloys. NiTi alloys are generally more expensive and possess superior mechanical properties when compared to copper-based SMAs.

In some embodiments, the passages 20 may be designed with a particular size and/or shape to establish the desired pressure that would be required to open the valves 30. FIGS. 4 and 5 illustrate an example embodiment where one of passages 20 includes a reservoir 32 (see passage 20 that is farthest to the right in FIGS. 4 and 5) that allows the pressure to build up within the passage 20 before the corresponding valve 30 opens. Although only one reservoir 32 is shown in FIGS. 4 and 5, any number of passages 20 may include reservoirs of varying sizes and shapes. It should be noted that each of the valves 30 may be designed to open at different pressure and/or temperature levels.

Other example embodiments relate to a method of cooling an electronic device 12. The method includes transferring heat from the electronic device 12 to a first fluid 22 that flows through a channel 18 in an impermeable section 16. The method further includes transferring heat from the electronic device 12 to a liquid holding section 16 that includes a second fluid 24 until the second fluid 24 boils and passes through a plurality of passages 20 in the impermeable section 16 into the channel 18 in the impermeable section 16.

The method may further include pumping the first fluid 22 through the channel 18 in the impermeable section 16 (see, e.g., pump 28 in FIG. 1). In addition, when the first and second fluids 22, 24 are different substances, the method may further include separating the first fluid 22 from the second fluid 24 once the first and second fluids 22, 24 exit the channel 18 in the impermeable section 16 (see, e.g., separator 26 in FIG. 1).

In some embodiments, transferring heat from the electronic device 12 to the liquid holding section 14 until the second fluid 24 boils may include ejecting the second fluid 24 from the plurality of passages 20 into the channel 18 in a direction that is orthogonal to the flow of the first fluid 22 within the channel 18 (see, e.g., FIG. 1). In other embodiments, transferring heat from the electronic device 12 to the liquid holding section 14 until the second fluid 24 boils may include ejecting the second fluid 24 from the plurality of passages 20 into the channel 18 in a direction that is partially the same as the flow of the first fluid 22 within the channel 18 (see, e.g., FIG. 2). It should be noted that embodiments are contemplated that include ejecting the second fluid 24 into the channel 18 in multiple directions and/or from multiple orientations.

The method may further include opening one or more valves 30 that prevent the flow of the second fluid 24 from the passages 20 into the channel 18. It should be noted the valves 30 may be opened and closed in any manner. As examples, opening one or more of the valves 30 may include (i) raising the temperature of the valves 30 to a certain level; and/or (ii) exposing the valves 30 to a pressure within the passages 20 that is sufficient to open the valves 30.

The electronic systems and methods described herein may be implemented utilizing a number of different types of electronic devices. The elements, materials, geometries, dimensions, and sequence of operations can all be varied to suit particular requirements.

FIGS. 1-5 are merely representational and are not drawn to scale. Certain proportions thereof may be exaggerated while others may be minimized.

The electronic systems and methods described above may provide a thermal solution for cooling high powered electronic devices. Many other embodiments will be apparent to those of skill in the art from the above description.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A method of cooling an electronic device, the method comprising:
    transferring heat from the electronic device to a first fluid that flows through a channel in an impermeable section; and
    transferring heat from the electronic device to a liquid holding section where the liquid holding section includes a second fluid until the second fluid boils and passes through a plurality of passages in the impermeable section into the channel in the impermeable section; and
    using a plurality of valves to prevent the flow of the second fluid from the passages into the channel.

2. The method of claim 1 further comprising opening at least one of the valves that prevents the flow of the second fluid from the passages into the channel.

3. The method of claim 2 wherein opening at least one of the valves includes raising the temperature of the valve to a certain level.

4. The method of claim 3 wherein opening at least one of the valves includes exposing the valve to a pressure within the corresponding passage that is sufficient to open the at least one valve.

5. The method of claim 1 wherein transferring heat from the electronic device to a liquid holding section includes spreading the second fluid throughout the liquid holding section via capillary action within the liquid holding section.

* * * * *